United States Patent
Fenouillet-Béranger et al.

(10) Patent No.: US 8,048,751 B2
(45) Date of Patent: Nov. 1, 2011

(54) METHOD FOR PRODUCING A FIELD EFFECT DEVICE HAVING SELF-ALIGNED ELECTRICAL CONNECTIONS WITH RESPECT TO THE GATE ELECTRODE

(75) Inventors: Claire Fenouillet-Béranger, Saint Martin d'Hères (FR); Philippe Coronel, Barraux (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/879,572

(22) Filed: Sep. 10, 2010

(65) Prior Publication Data
US 2011/0059589 A1    Mar. 10, 2011

(30) Foreign Application Priority Data
Sep. 10, 2009 (FR) .................... 09 04323

(51) Int. Cl.
*H01L 21/336* (2006.01)

(52) U.S. Cl. .................. 438/299; 257/E21.44

(58) Field of Classification Search .......... 438/299, 438/229, 320, 339, 364; 257/E21.409, E21.44
See application file for complete search history.

(56) References Cited

U.S. PATENT DOCUMENTS 6,281,051 B1 * 8/2001 Tsutsumi .................. 438/142
6,303,449 B1   10/2001 Pan et al.
2009/0140431 A1   6/2009 Feustel et al.

* cited by examiner

*Primary Examiner* — Ha Tran T Nguyen
*Assistant Examiner* — Shaun Campbell
(74) *Attorney, Agent, or Firm* — Oliff & Berridge, PLC

(57) ABSTRACT

A gate dielectric, an insulating layer and an etching mask are formed on substrate. The etching mask delineates at least the gate electrode and the source and drain contacts and the source, drain and gate output lines of the first metal level of a field effect device. The gate electrode and the future source and drain contacts are formed simultaneously by etching of the insulating layer. A gate material is deposited to form the gate electrode. The source and drain contacts are formed at least in the insulating layer. The source, drain and gate output lines of the first metal level are formed in the etching mask.

19 Claims, 13 Drawing Sheets

METHOD FOR PRODUCING A FIELD EFFECT DEVICE HAVING SELF-ALIGNED ELECTRICAL CONNECTIONS WITH RESPECT TO THE GATE ELECTRODE

BACKGROUND OF THE INVENTION

The invention relates to a method for producing a field effect device comprising source, drain and gate output lines respectively connected to source, drain and gate contacts in a first metallic interconnection level, said contacts being respectively arranged on source, drain and gate electrodes.

STATE OF THE ART

The ever-continuing improvement of performances of integrated circuits for example in terms of consumption and/or operating frequency is ineluctably leading to a constant reduction in the size of their components. In order to produce devices with even better performances, new architectures and/or new materials have been integrated in transistors.

Reducing the size of the transistor results in increasing the stresses related to alignment of the different photolithographic levels with respect to one another. In conventional manner, when producing a field effect transistor, definition of the source, drain and gate contact areas and alignment of the first metal level with respect to these contacts are among the most critical steps. The contacts do in fact have to be aligned with respect to the gate electrode which is itself defined with respect to the active area by means of a specific photolithographic level. The same is true for the electrical connection made by the first metal level which makes a part of the interconnection of all the transistors of the integrated circuit. This results in the contacts and the first metal level having to be aligned with respect to the gate and their respective electrodes while at the same time taking account of the misalignment existing between the active area and the gate.

From an industrial standpoint, alignment of one photolithographic level with respect to another involves large repeatability constraints on the photolithography equipment and integration of safety margins in design of the transistors. Alignment of the contact areas is therefore a critical step in the field effect transistor production process. Misalignment leads to a very large dispersion in performances of the transistors obtained and in losses of efficiency of the fabricated circuits.

In conventional manner as illustrated in FIGS. 1 to 6, a field effect transistor comprises a source electrode 1, a drain electrode 2 and a gate electrode 3 which respectively comprise a source contact area 4, a drain contact area 5 and a gate contact area 6. Source contact area 4, drain contact area 5 and gate contact area 6 are respectively covered by a source output line 7, a drain output line 8 and a gate output line 9 of the first metal level, also called Metal 1 or M1.

Source electrode 1 and drain electrode 2 are formed in an active area on each side of a channel which is located underneath gate electrode 3 (FIG. 1). The channel and source electrode 1 and drain electrode 2 are formed in the active area, which is a layer of semiconducting material 10.

As illustrated in FIG. 2, the active area, made from semiconducting material 10, is formed on a substrate 11 and is surrounded by a dielectric material 12. Dielectric material 12 is for example a lateral insulation pattern which electrically insulates active area 10 from the other semiconducting material layers which are present on substrate 11, i.e. from the other active areas 10. Active area 10 is typically made from silicon, germanium, or an alloy of these materials, in strained or relaxed state. Dielectric material 12 is for example a silicon oxide based material and substrate 11 can be a bulk substrate made from semiconducting material or a substrate on insulator of SOI type.

As illustrated in FIG. 2, a gate dielectric 13 and a gate material layer 14 are then formed on substrate 11. Gate dielectric 13 can be a silicon oxide or a high-k material. It is produced in conventional manner, for example by thermal oxidation, by chemical vapor deposition, plasma enhanced or not, or by atomic layer deposition. Gate material 14 is conventionally a semi-conducting material, for example made from polycrystalline silicon, but it can also be a metallic material. Typically, gate material 14 is deposited by chemical vapor deposition.

A masking material 15 is then deposited on gate material 14 and is patterned so as to form an etching mask 16. As illustrated in FIG. 3, this etching mask is then used as hard mask for patterning gate material 14 and for forming gate electrode 3. Etching mask 16 is formed in conventional manner, that is to say by means of a photoresist that is exposed to form a temporary mask. The temporary mask is then transferred by etching in masking layer 15 to form etching mask 16 (FIG. 3).

Etching mask 16 used for etching gate electrode 3 has to be aligned with respect to active area 10. It will indirectly define source area 1 and drain area 2 which are situated in active area 10 on each side of the gate. In ideal manner, gate electrode 3 is arranged in the middle of active area 10 so as to have a symmetrical device, i.e. source area 1 and drain area 2 having substantially the same size (FIG. 4).

As illustrated in FIGS. 5 and 6, source electrode 1, drain electrode 2 and gate electrode 3 having been formed, a covering material 17 is deposited and a new etching mask is formed. This new etching mask is used to form source 4, drain 5 and gate 6 contact areas respectively on source 1, drain 2 and gate 3 electrodes (in broken lines). This new etching mask has to be aligned with respect to active area 10 but it also has to be aligned with respect to gate electrode 3. In FIG. 6 seen from above, the active area and the gate electrode are both covered by covering material 17.

Misalignment of the source and drain contacts with respect to the gate means that a source or drain contact is closer to the channel. This then results in a difference in the value of the capacitances that exist between the contacts and gate. This inequality of values then leads to an impairment of the performances of the transistor due to modification of the access resistance between source and drain electrodes. There is then also a risk of short-circuiting between the gate and the contacts made on the source and/or drain areas if the misalignment is too great.

Once source 4, drain 5 and gate 6 contacts have been formed, they are covered by the first metal level, i.e. by the metallic material patterns formed in a layer of insulating material. The first metal level constitutes the first of the integrated circuit interconnection levels. It is from this first metal level that the transistors start to be connected to one another. This first metal level comprises source 7, drain 8 and gate 9 output lines which are respectively connected to source 4, drain 5 and gate 6 contacts.

Source 7, drain 8 and gate 9 output lines of the first metal level are formed in similar manner to source 4, drain 5 and gate 6 contact areas. The covering material and contact areas are covered by a new covering material and the latter is patterned to allow access to the contact areas and to define the shape of the metal lines. As first metal level M1 connects all the transistors of the integrated circuit, a trade-off has to be found between the safety margins of the photolithographic steps and the dimensions of the connection areas in order to prevent short-circuiting, achieve maximum compactness and enable a functional circuit to be obtained in spite of the variabilities of the fabrication method.

There again, misalignment of source 7, drain 8 and gate 9 output lines of the first metal level with respect to source 4, drain 5 and gate 6 contacts results in reduced performances of the device and therefore of the circuit.

OBJECT OF THE INVENTION

The object of the invention is to provide a field effect device that presents a perfect alignment of the source and drain contacts with respect to the gate electrode and of the source, drain and gate output lines of the first metallic interconnection level with respect to the source, drain and gate contacts. The gate contact area is also preferably perfectly aligned with respect to the gate electrode.

The method according to the invention is characterized in that it successively comprises:
formation of an insulating layer on a gate dielectric,
making an etching mask laterally delineating at least the gate electrode, source and drain contacts and source, drain and gate output lines of the first metallic interconnection level,
masking the source, drain and gate output lines in the etching mask,
simultaneous delineation of the gate electrode and of the source and drain contacts in the insulating material,
deposition of a gate material forming at least the gate electrode,
formation of the source and drain contacts at least in the insulating layer, and of the source, drain and gate output lines of the first metal level in the etching mask.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
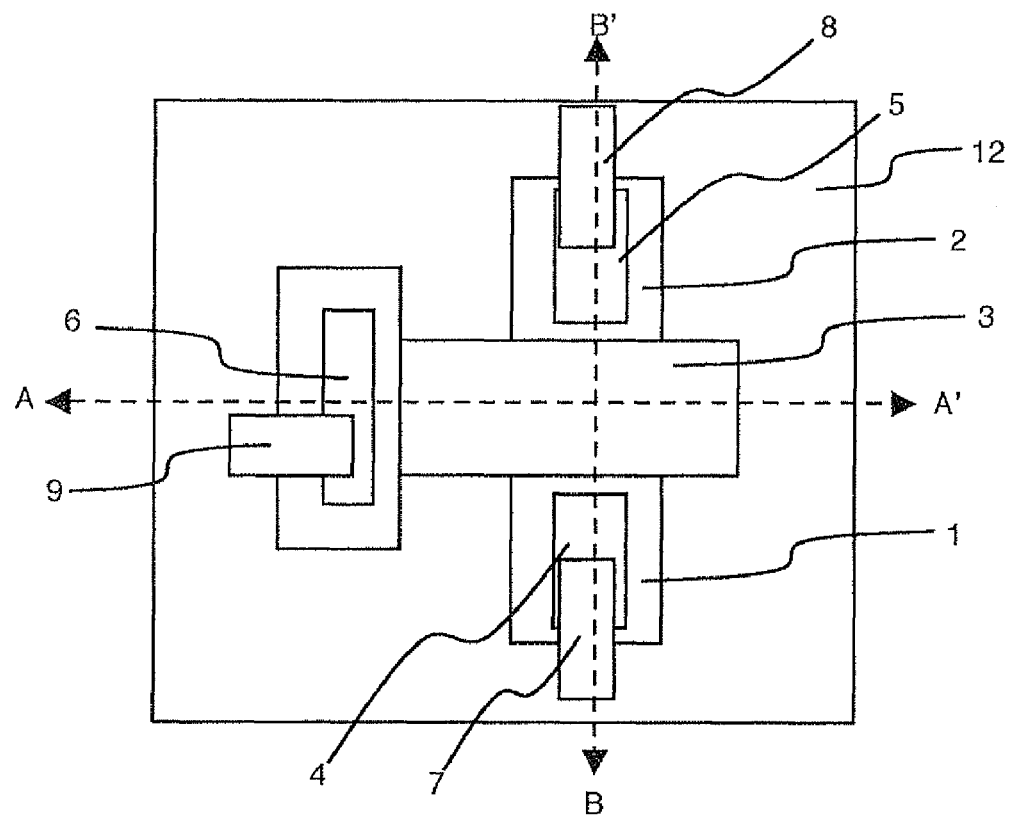
FIGS. 1 to 6 represent successive steps of performing a method according to the prior art, in schematic manner in top view and in cross-section.
Figure 2:
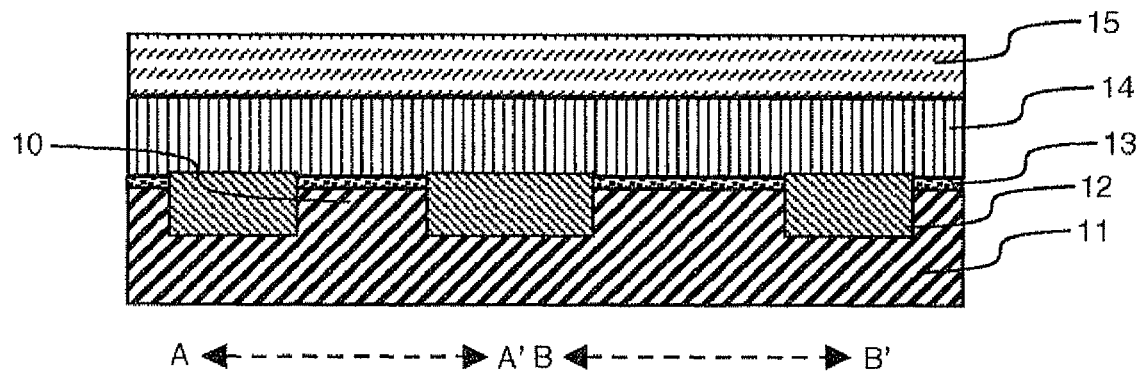
Figure 3:
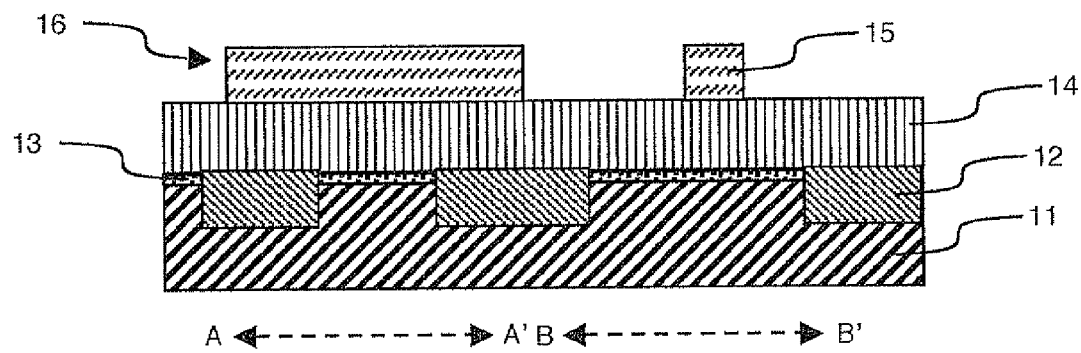
Figure 4:
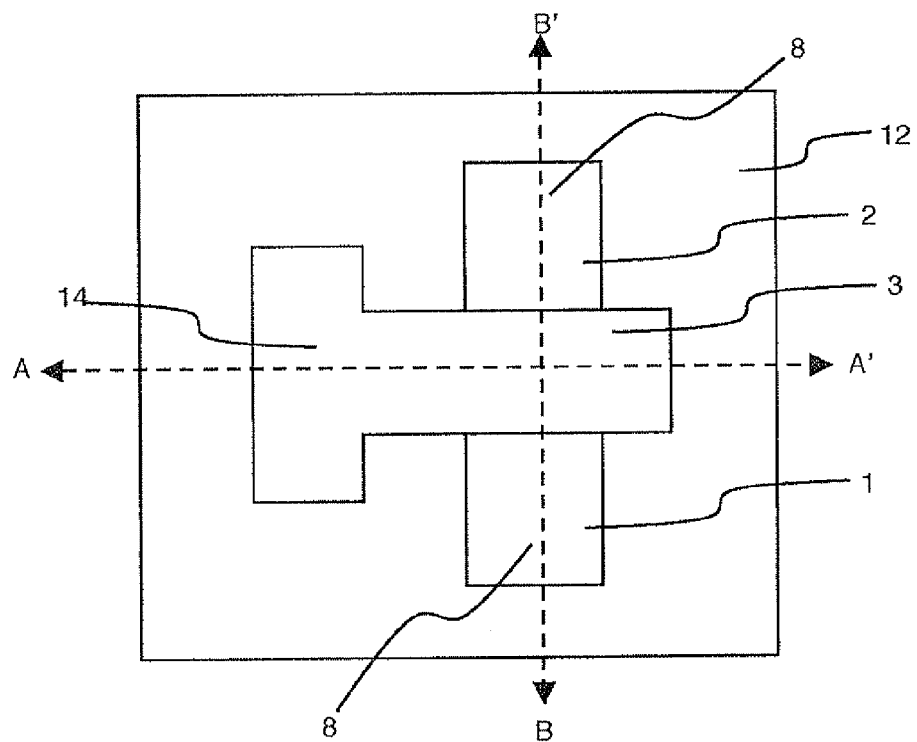
Figure 5:
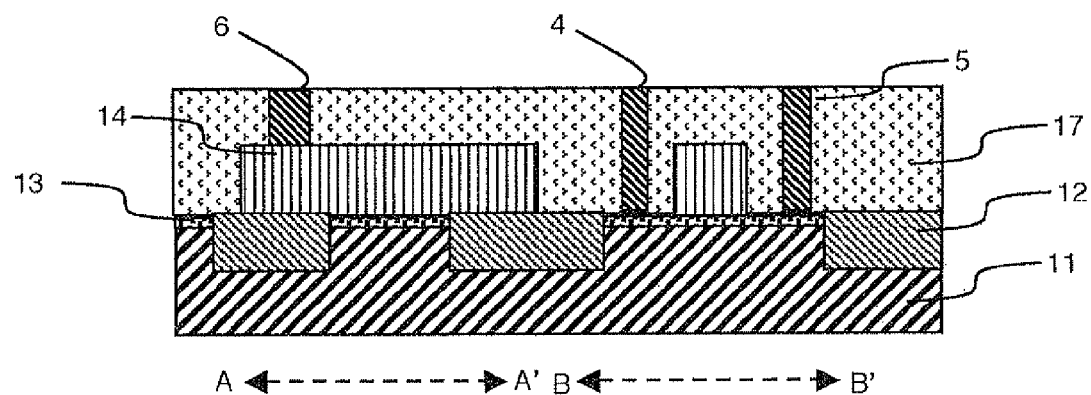
Figure 6:
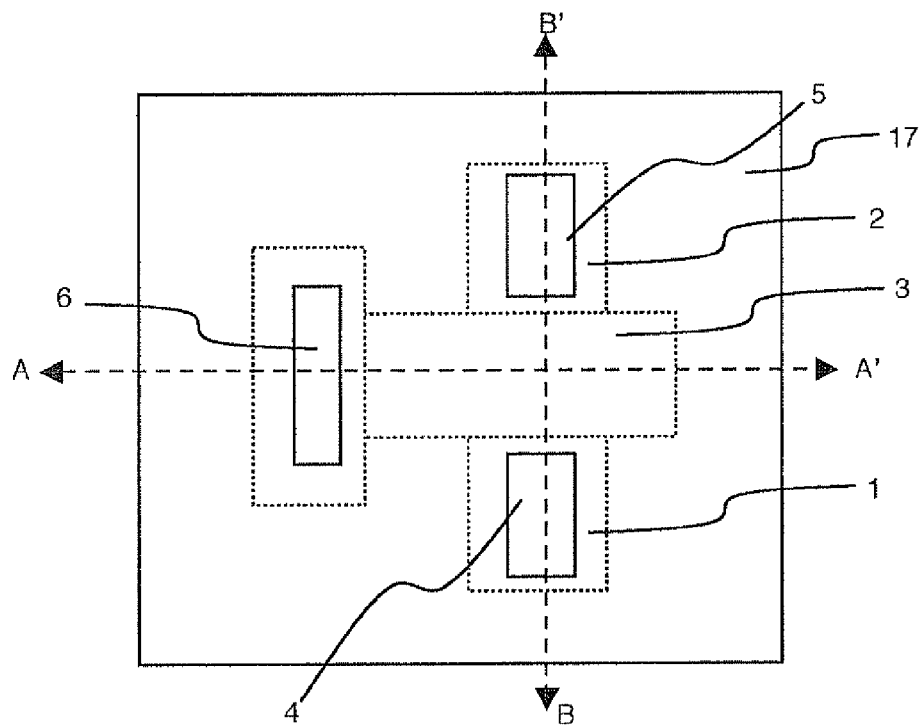

The method for fabricating a field effect device according to the invention successively comprises formation of gate dielectric 13 and of an insulating layer formed by a single layer or by a stack of layers on substrate 11. The insulating layer comprises for example first 18 and second 19 elementary layers made from insulating materials. The insulating layer also comprises a top insulating layer 20 within which an etching mask 16 is formed, for example by photolithography and etching. Insulating layer 18, 19, 20 is formed by one or more dielectric materials which are electrically insulating, for example a silicon oxide and/or nitride. Top insulating layer 20 typically has a thickness of about 250 nm and insulating layer has an overall thickness of about 700 nm.

Substrate 11 also comprises an active area 10 made from semiconducting material that is surrounded by a dielectric material 12. The active area is thus electrically insulated in lateral manner at least from the other active areas by the patterns of dielectric material 12. Substrate 11 can be a bulk substrate made from semiconducting material or a substrate of semiconductor on insulator type.

Figure 7:
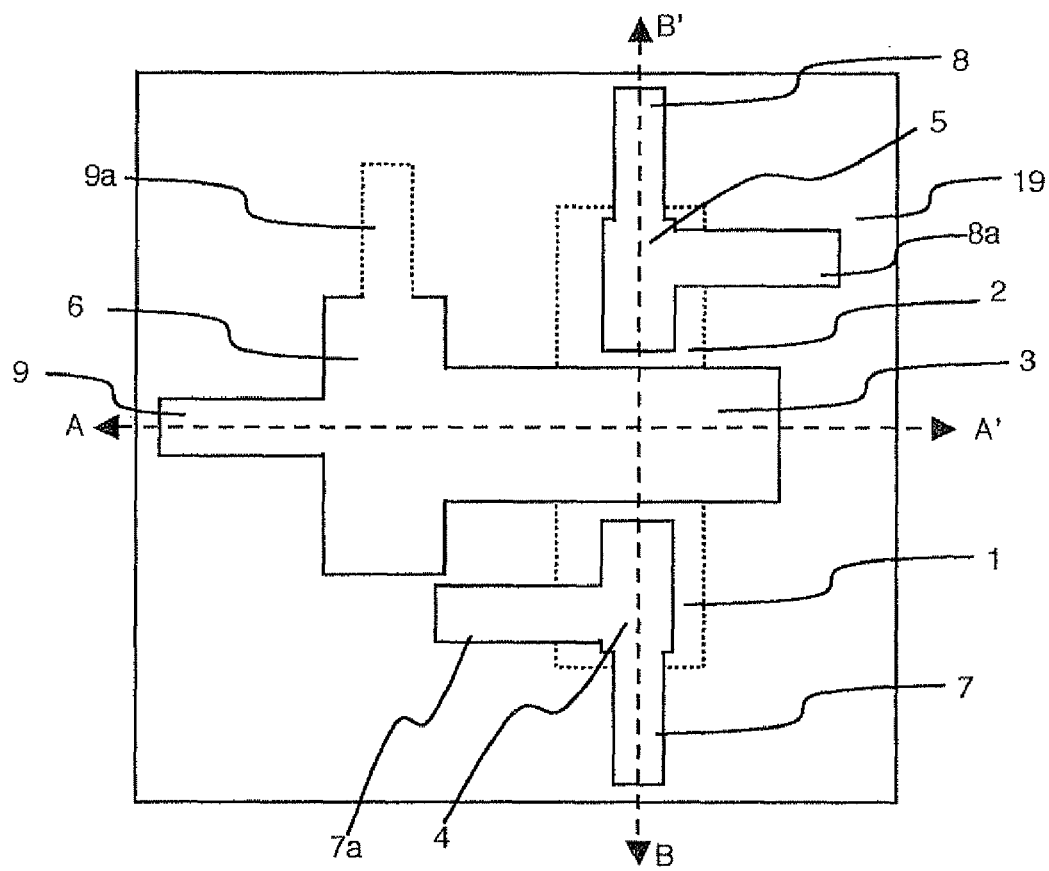
FIGS. 7 to 19 represent successive steps of performing a method according to the invention, in schematic manner in top view and in cross-section.
Figure 8:
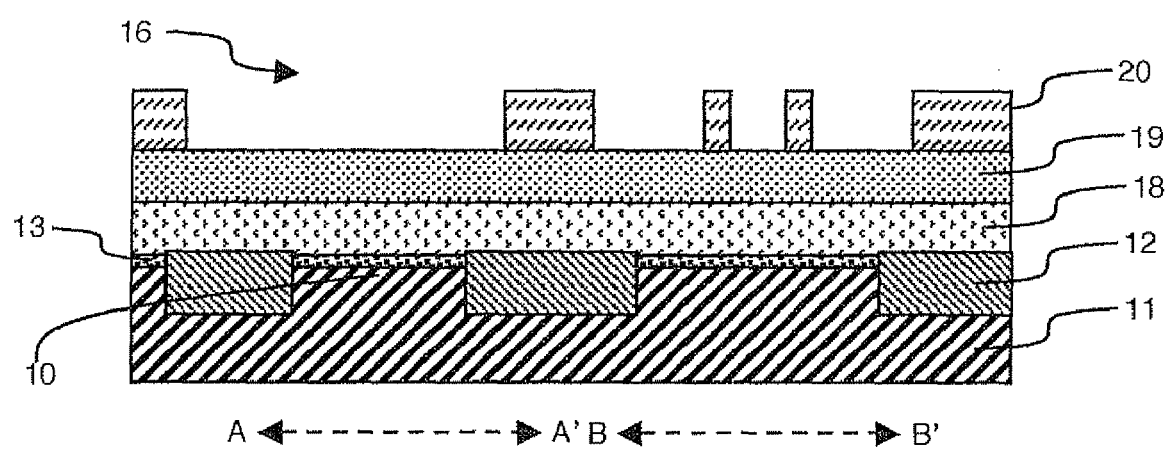

As illustrated in FIGS. 7 and 8, etching mask 16 comprises the pattern of gate electrode 3 which serves the purpose of delineating source 1 and drain 2 electrodes in active area 10. Etching mask 16 also comprises the pattern of the areas delineating the future source 4 and drain 5 contacts which will be formed on source 1 and drain 2 electrodes. Etching mask 16 further comprises the pattern of the source 7, drain 8, and gate 9 output lines of the first metallic interconnection level also called first metal level. These output lines will connect source 4, drain 5 and gate 6 contacts of all the transistors of an integrated circuit. These first metal level output lines are generally completed by additional interconnection levels. The source, drain and gate output lines of the first metal level connect the transistor to the other integrated circuit devices to form a predefined function. The first metallic interconnection level is formed by a plurality of metallic material patterns which are surrounded by an electrically insulating material. Source 7, drain 8, and gate 9 output lines of the first metallic interconnection level are metallic material patterns which form lines or vias. A via is an essentially vertical pad the purpose of which is to make the current flow to an upper interconnection level.

By means of the pattern formed in the etching mask, it is possible with a single photolithographic level to laterally define the position of source 1 and drain 2 electrodes and of source 4, drain 5 and gate 6 contacts and of source 7, drain 8, and gate 9 output lines of the first metal level, with respect to gate electrode 3.

The conventional pattern of gate electrode 3 is extended on the side where the future gate contact 6 is to be located by the pattern of gate output line 9 of the first metallic interconnection level.

The pattern of source 4 and drain 5 contacts is also extended respectively by the patterns of source 7 and drain 8 output lines of the first metal level. The patterns of source 7 and drain 8 output lines of the first metal level are formed for example on the edges farthest away from the gate electrode (areas 7 and 8), but they could be formed on other lateral edges of the contact area provided there is sufficient space (output lines 7a and 8a). In the particular example of FIG. 7, by eliminating output lines 7a and 8a, the source and drain patterns (contact and first metal level) present an axis of symmetry which is perpendicular to the axis of symmetry of gate electrode 3 (without line 9a).

The shapes of gate electrode 3, source 4 and drain 5 contacts and source 7, drain 8, and gate 9 output lines of the first metal level are represented in etching mask 16 by void areas delineated by top insulating layer 20. Top insulating layer 20 acts as hard mask for the subsequent etching steps. The etching mask is therefore chosen from a material that is sufficiently resistant to act as hard mask, and it presents a sufficient thickness to be able to subsequently integrate the first metal level. The patterns of the gate electrode and of the gate output line only form a single void area in mask 16. Likewise, the patterns of source contact 4 and of source output line 7 and the patterns of source contact 5 and of source output line 8 each form a single void area.

Once etching mask 16 has been formed, source 7, drain 8 and gate 9 output lines are masked by any suitable technique so as to only etch the areas laterally delineating the gate electrode and the source and drain contacts in the insulating layer. This mask can be achieved simply by an additional photolithography step prior to etching.

It is also possible to use a first sealing material 21 with the etching mask. First sealing material 21 forms first plugs in the etching mask or above the etching mask so as to subsequently only etch the gate electrode and the source and drain contacts in the insulating layer. In an alternative embodiment (not represented), once first sealing material 21 has been deposited, the additional photolithography step leaves the pattern of gate electrode 3, of source 4 contact and of drain 5 contact free to eliminate first sealing material 21 in these areas. In another alternative embodiment (not represented), it is also possible to use a photolithography step presenting a reverse polarity pattern to that described in the foregoing, and in this case the first sealing material will be patterned by a technique called "lift-off". In these embodiments, there are no dimensional constraints on the first metal level output lines.

In a privileged embodiment, source 7, drain 8, and gate 9 output lines of the first metal level present a longitudinal and/or transverse dimension that is smaller than the smallest of the longitudinal and/or transverse dimensions of gate electrode 3 and of source 4 and drain 5 contact areas.

In FIG. 7, the pattern of gate electrode 3 and gate output line 9 of the first metal level presents an axis of symmetry AA' that enables at least three portions to be defined along this axis in the gate pattern. The gate pattern comprises a narrow portion, here rectangular, that defines the gate output line 9 of the first metal level. This narrow portion is followed by a wide portion within which gate contact 6 will be formed. The wide portion is itself followed by an intermediate portion that delineates the gate electrode above the active area and therefore the physical length of the channel. The intermediate portion therefore covers active area 10 so as to define source 1 and drain 2 electrodes. Source 1 and drain 2 electrodes are arranged on each side of gate electrode 3 and therefore of axis of symmetry AA'.

In general manner, the narrow portion is separated from the intermediate portion by the wide portion. It is not necessary for the gate pattern to present an axis of symmetry. It is perfectly conceivable to offset the wide portion from the intermediate portion so as to form for example an L shape. The narrow portion can also be offset with respect to the wide portion. It is not necessary for the three portions to be aligned, the narrow portion being able to be directed in another direction as represented for example by additional gate output line 9a. It is also conceivable to form several first metal level gate output lines 9 for a single gate contact area 6.

In general manner, the wide portion presents larger transverse and longitudinal dimensions than the smallest of the transverse and longitudinal dimensions of the intermediate portion, here along axis BB' which connects the source and drain. Typically, the dimensions of the wide portion of the gate are at least 10 nm larger than the dimension of the gate that defines the channel length, i.e. the distance between the source electrode and drain electrode. In general manner, axis AA' represents the longitudinal direction of the gate and the source and drain electrodes are arranged on each side of this axis AA'.

Figure 9:
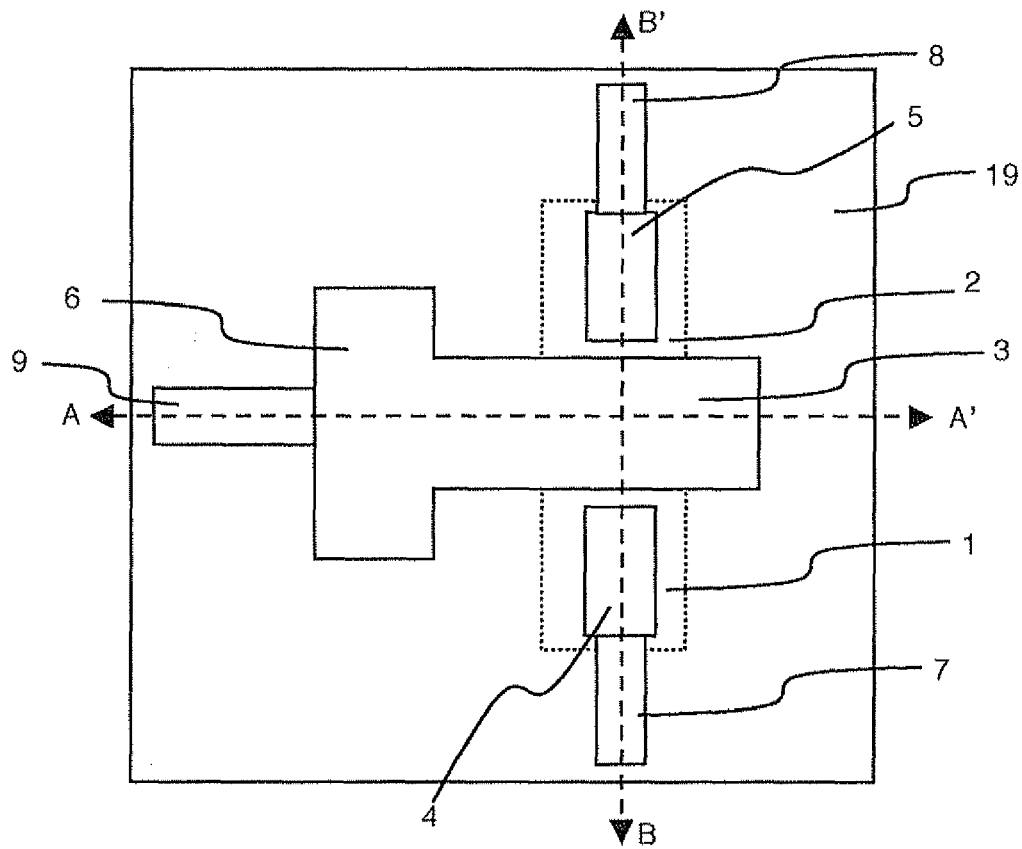
Figure 10:
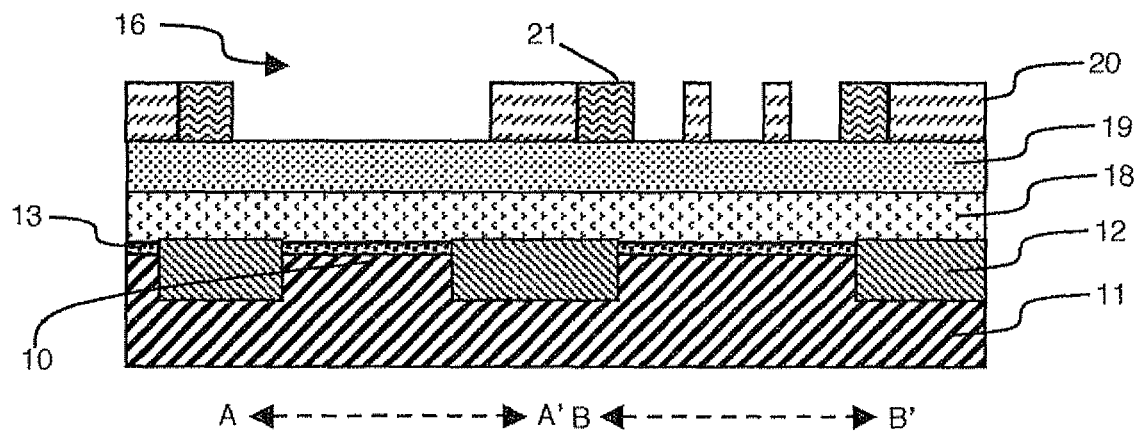

By means of these dimensional constraints, first metal level source 7, drain 8, and gate 9 output lines can be sealed without using an additional photolithographic level. As illustrated in FIGS. 9 and 10, first sealing material 21 is deposited in conformal manner, i.e. in homogeneous manner on the horizontal and vertical surfaces of etching mask 16, on top insulating layer 20 and on insulating layer 19. The thickness of first sealing material 21 is chosen such as to seal off source 7, drain 8 and gate 9 output lines of first metal level in etching mask 16. First sealing material 21 is then etched isotropically so as to eliminate material 21 deposited on the etching mask and the material deposited in the areas delineating source 4 and drain 5 contacts and in the pattern of gate electrode 3. First sealing material 21 is for example made from polysilicon or from a polycrystalline or amorphous silicon-germanium alloy. In general manner, first sealing material 21 is made from a material enabling selective etching of layers 18 and 19 while at the same time allowing etch stopping on layers 12 and 13. First sealing material 21 also has to be able to be eliminated selectively with respect to the other materials in presence. In the example of FIG. 9, first plugs of material 21 delineate source 7, drain 8 and gate 9 output lines in the etching mask. Distinct patterns can then be observed in top view.

Figure 11:
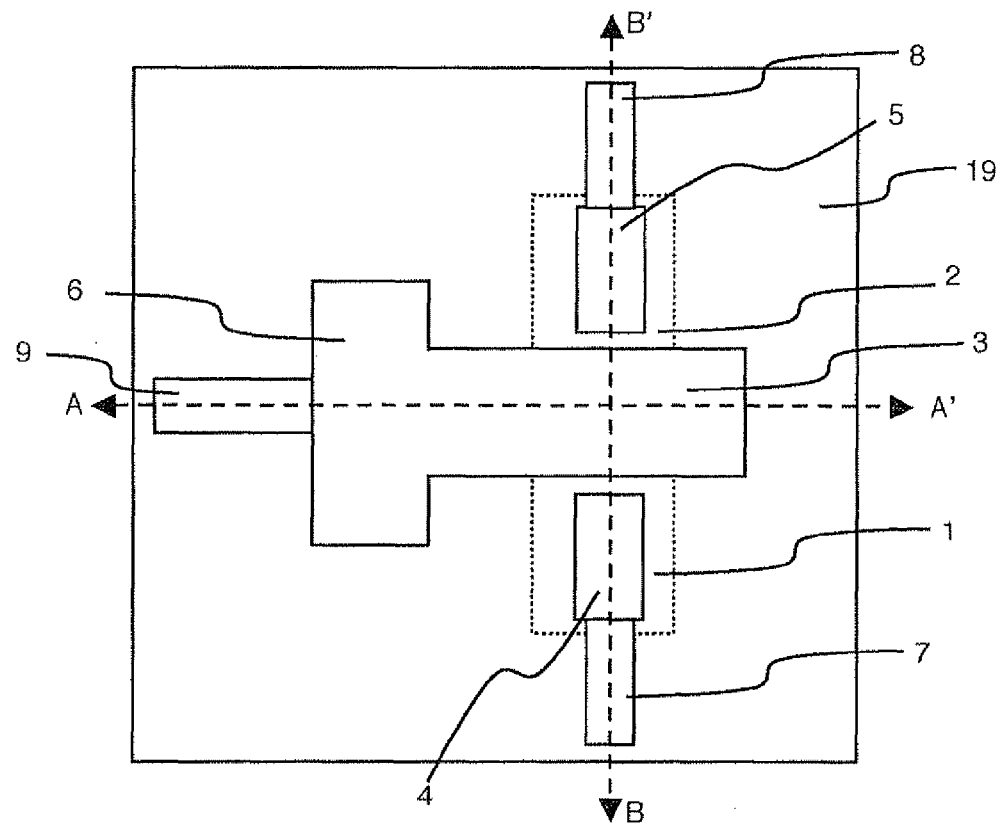
Figure 12:
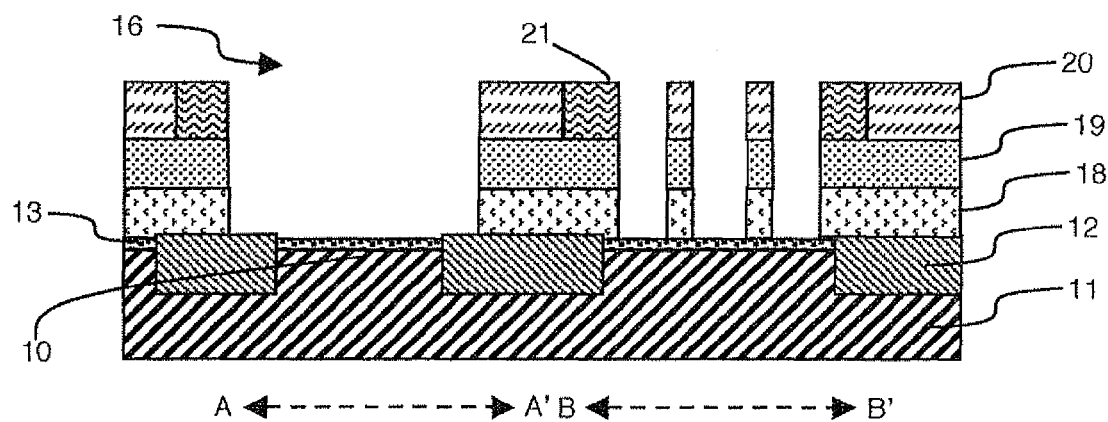

As illustrated in FIGS. 11 and 12, anisotropic etching is performed to pattern the insulating layer at the level of first 18 and second 19 elementary layers of insulating material. The shape of gate electrode 3 is defined at the same time as the areas delineating source 4 and drain 5 contacts by void areas formed in first 18 and second 19 elementary layers of insulating material as illustrated in FIG. 12 in cross-section. The shape of gate electrode 3 is thus defined in the insulating layer and etching stops on gate dielectric 13 and on dielectric material 12.

Once gate electrode 3 and source 4 and drain 5 contacts have been delineated laterally in the insulating layer, masking of the future source 4 and drain 5 contacts is performed before gate electrode 3 is formed.

Masking can be performed in different manners. For example, masking can be achieved by an additional photolithography step which only leaves the area delineating gate electrode 3 free. In this case, gate material 23 is deposited by directional deposition, for example by evaporation, and patterning of the latter is performed by a technique called "lift-off". It is also possible to use a second sealing material 22 which will form second plugs above or in the future source 4 and drain 5 contacts. As previously for formation of the first plugs, second sealing material 22 can be patterned by means of at least one additional photolithography step to form second plugs (not represented).

Figure 13:
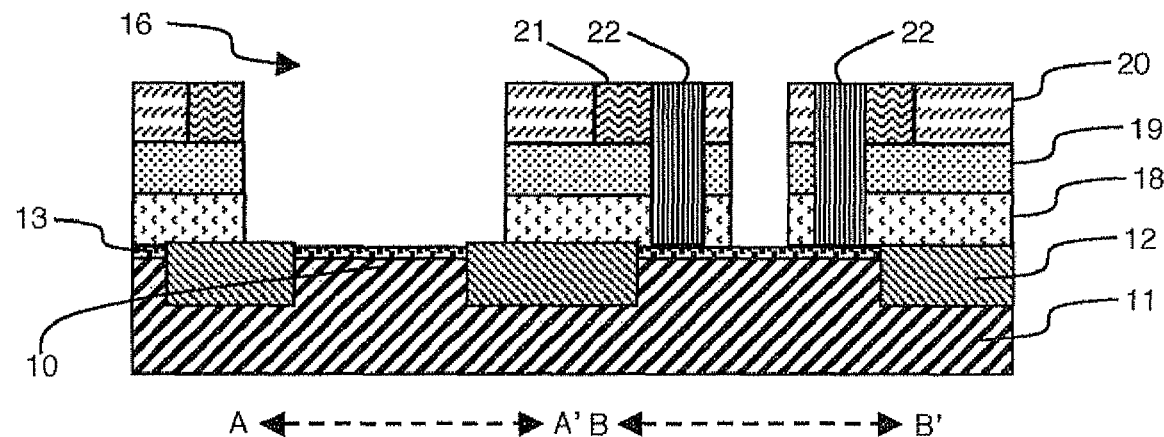
Figure 14:
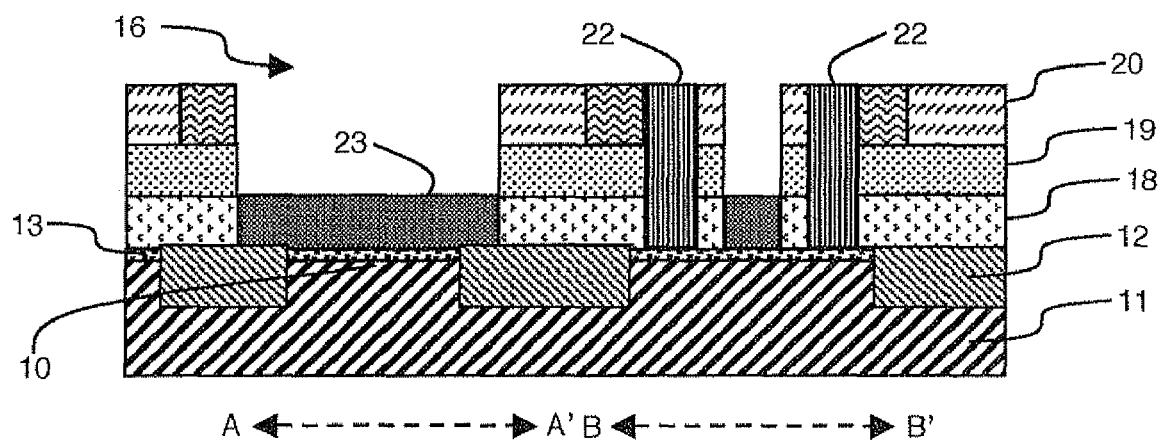

In a privileged embodiment as illustrated in FIG. 13, second plugs made from second sealing material 22 are then formed at least in etching mask 16 to seal off source 4 and drain 5 contact areas left free. As illustrated in FIG. 14, second plugs of second sealing material 22 advantageously fill the former void volume of first 18 and second 19 elementary layers of insulating material and of etching mask 16, which corresponds to the areas of the future source 4 and drain 5 contact. The second plugs are formed by second sealing material 22 which is also deposited in conformal manner. A predefined thickness of second sealing material 22 is deposited, which has the effect of sealing off the areas delineating source 4 and drain 5 contacts. Second sealing material 22, deposited on the etching mask and in the area laterally delineating the gate electrode, is eliminated by means of isotropic etching. Second sealing material 22 is for example made from tetraethylorthosilicate (TEOS).

If the first plugs of first sealing material 21 were eliminated before deposition of second sealing material 22, the first plugs are then reformed by the second sealing material. According to the embodiments, it may be necessary to have first and second plugs formed from different materials.

At this stage, the first plugs that were sealing off source 7, drain 8 and gate 9 output lines of the first metal level are preserved.

As illustrated in FIG. 14, a gate material 23 is formed in the void volume that delineates gate electrode 3. The gate material forms gate electrode 3. Location of gate material 23 in the void volume delineating the gate electrode is achieved by depositing the gate material until the latter completely fills the whole volume delineating gate electrode 3. As gate material 23 is also deposited on etching mask 16, a chemical mechanical polishing step is performed to eliminate the gate material from the volume of gate electrode 3.

Advantageously, isotropic etching, for example by chemical etching by plasma, is then performed to eliminate the top part of gate material 23 and thereby localize this material only in the bottom part of the volume delineating gate electrode 3. Gate material 23 then presents a thickness substantially equal to that of first insulating material layer 18.

In a particular embodiment, the metallic gate, contact and associated first metal level are formed in a single step and from the same material. There is then no longer any clear distinction between the electrode, its contact and the first metal level. Advantageously, the material used is copper. If necessary, there can be a difference in the materials used and/or in the order of formation of the devices in order to be able to differentiate between PMOS and NMOS devices. In this particular embodiment, the first plugs are eliminated before gate material 23 is formed. In this embodiment, the first plugs are eliminated before material 23 is deposited.

Figure 15:
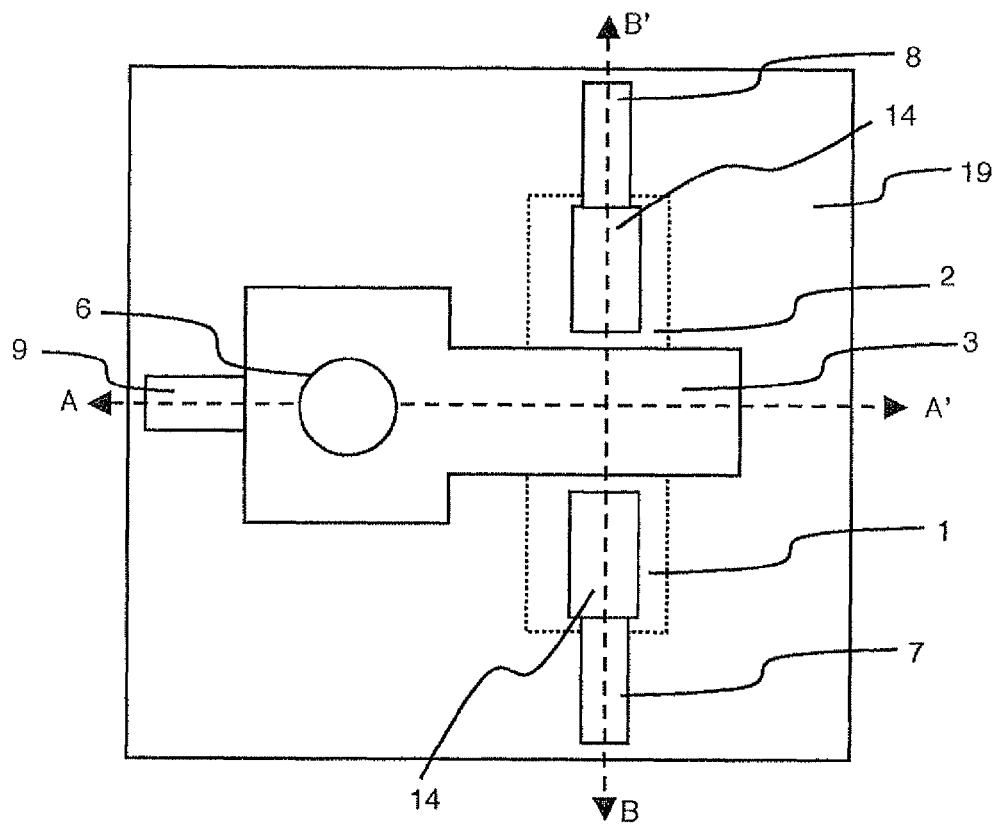
Figure 16:
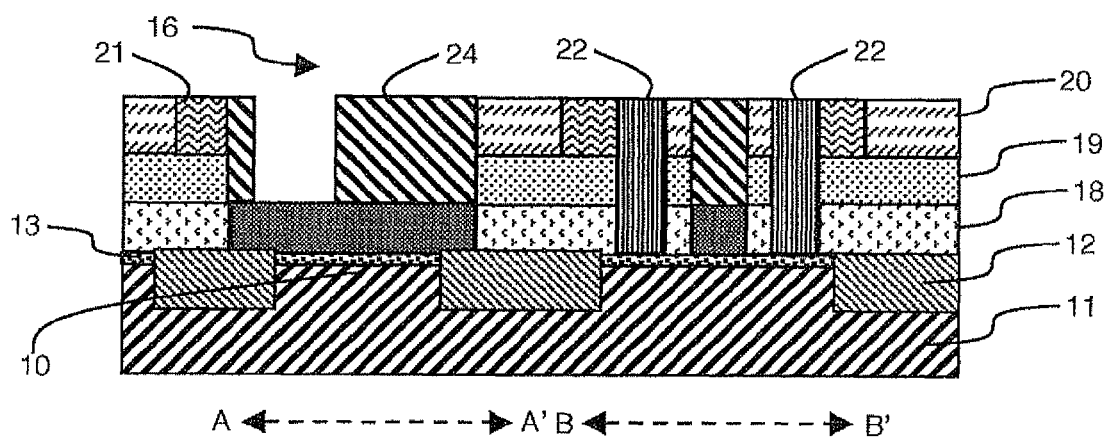

As illustrated in FIGS. 15 and 16, if gate material 23 does not fill the whole volume of the gate, a covering material 24 is deposited in conformal manner on etching mask 16, insulating layer and gate material 23. Deposition being conformal, covering material 24 covers all the visible horizontal or vertical surfaces of the device in uniform manner. The thickness of covering material 24 and the conditions of the isotropic etching process are chosen such as to completely fill the volume of etching mask 16, and here the second insulating material layer 19 which corresponds to the intermediate portion, while leaving a part of gate material 23 accessible in the wide portion of the gate so as to form the area delineating gate contact 6. The thickness of material 24 that is deposited therefore has to be sufficiently large to seal off the intermediate portion (gate electrode 3 above the active area) while being sufficiently thin not to completely seal off the wide portion which contains the future gate contact 6. A depression must remain in material 24 at the level of the wide portion. Contact areas 7, 8 and 9 of the first metal level are sealed off by first plugs 21. The covering material is advantageously an insulating material, for example silicon oxide or nitride or a mixture of these two materials.

In non-compulsory manner, covering material 24 is then subjected to a chemical mechanical polishing step in order to eliminate covering material 24 that is situated above etching mask 16. Chemical mechanical polishing can be performed if some covering material 24 remains on the etching mask after the isotropic etching step.

The free surface of gate material 23 that is located in the wide portion corresponds to gate contact 6. The free surface here has a circular shape and is located in the centre of the wide portion, as illustrated in FIG. 15 in top view. The shape of future gate contact 6 and the position thereof depend on the initial shape of the wide portion of the gate and on the thickness of covering material that has been deposited.

Figure 17:
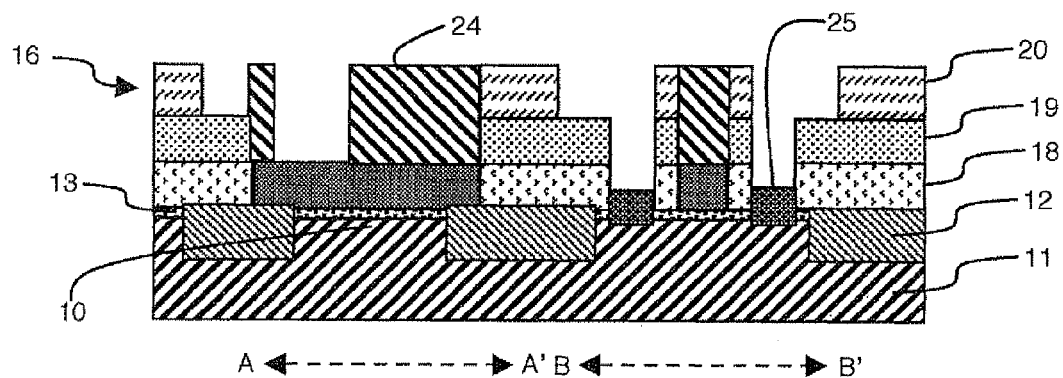

As illustrated in FIG. 17, the second plugs are eliminated selectively with respect to the other materials present. Gate dielectric 13 left free is in turn eliminated to allow access to active area 10. The bared parts of active area 10 forming the interface with source 4 and drain 5 contacts can for example undergo implantation of dopants and/or selective epitaxy. Active area 10, at the level of source 4 and drain 5 contacts, can also be silicided to improve taking contacts on the device. A metal is deposited on the device and is subjected to thermal treatment to make it react with the material of active area 10. This reaction forms a silicide 25 in the source and drain active areas.

During this technological step, the first plugs can be eliminated, for example at the same time as the second plugs or after formation of the silicide. In this same technological step, covering material 24 can undergo anisotropic or isotropic etching. Isotropic etching has the effect of enlarging gate contact area 6 and of reducing the thickness of the covering material. Anisotropic etching achieves thinning of the covering material without really modifying the dimensions of the gate contact.

Figure 18:
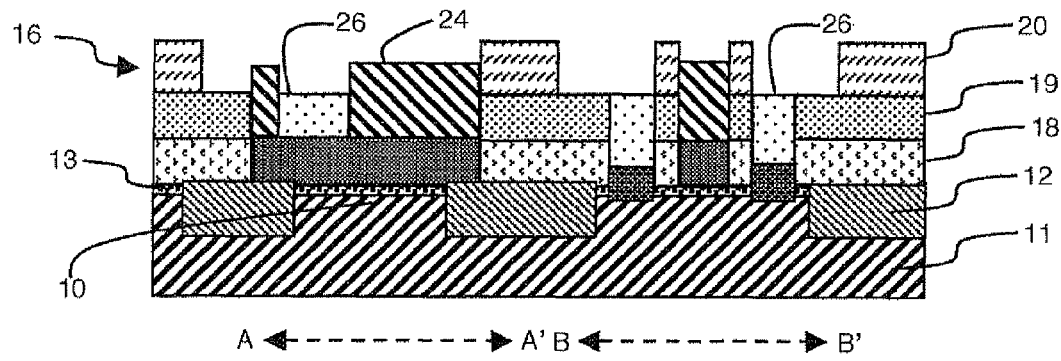

As illustrated in FIG. 18, a metallic material 26 is then deposited to form at least source 4, drain 5 and gate 6 contacts. Metallic material 26 being deposited on the whole of the device, it is subjected to a chemical mechanical polishing step to localize it only in etching mask 16 and/or in the insulating layer at the level of the source, drain and gate. Advantageously, it is also subjected to an additional etching step to localize it to only form the source, drain and gate contacts.

Figure 19:
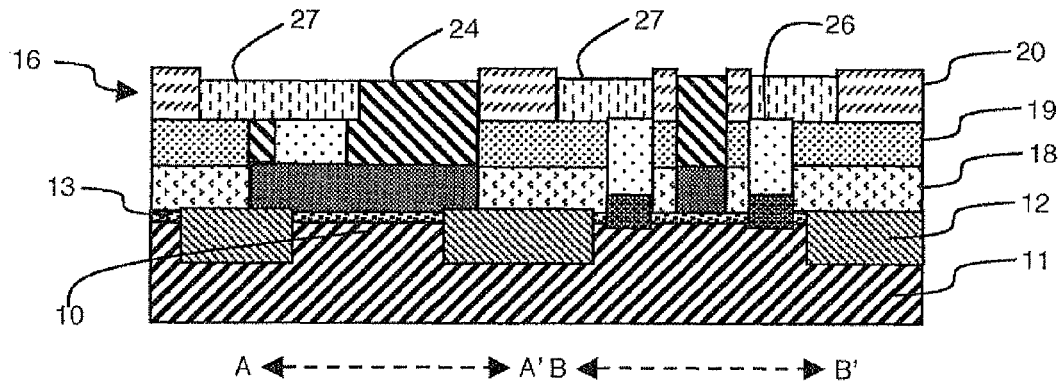

As illustrated in FIG. 19, a second material metallic 27 forming the first metal level is then deposited and patterned. Patterning is achieved for example by chemical mechanical polishing. Source 7, drain 8 and gate 9 output lines of the first metal level are thereby in connection respectively with source 4, drain 5 and gate 6 contact areas. If an insulating material prevents connection between the gate contact and the gate area of the first metal level, this insulating material is etched. In the example of FIGS. 18 and 19, the covering material is subjected to advantageously isotropic etching.

Figure 20:
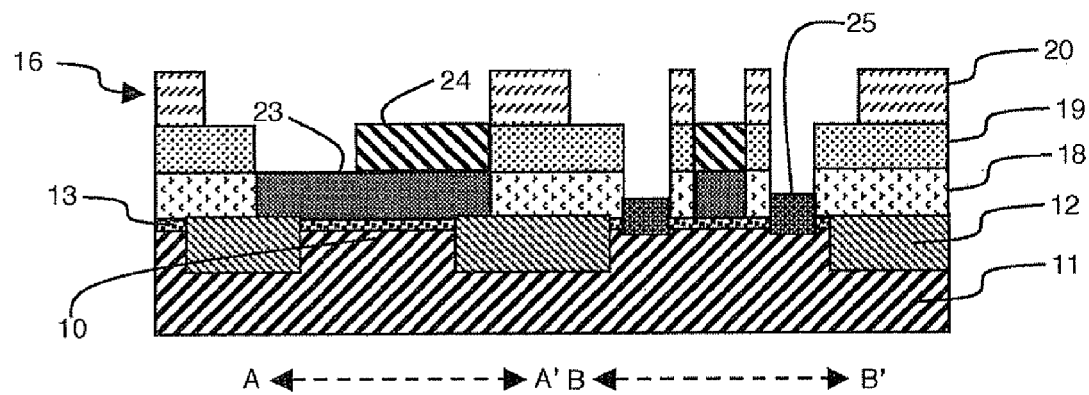
FIGS. 20 and 21 represent successive steps of performing an alternative of the method according to the invention, in schematic manner in top view and in cross-section.

As illustrated in FIG. 20, in an alternative embodiment after FIG. 17, the firsts plugs are eliminated and covering material 24 is partially eliminated in order to be preferably localized in the intermediate portion of the gate. Covering material 24 can be subjected to anisotropic etching, for example plasma or wet channel etching. As a variant, covering material 24 can be eliminated by means of an additional photolithography step which only makes the wide portion of the gate accessible, followed by an etching step. In an extreme case (FIG. 20), covering material 24 only remains in the intermediate portion of the gate pattern and gate contact 6 is formed by the wide portion of the gate pattern.

Figure 21:
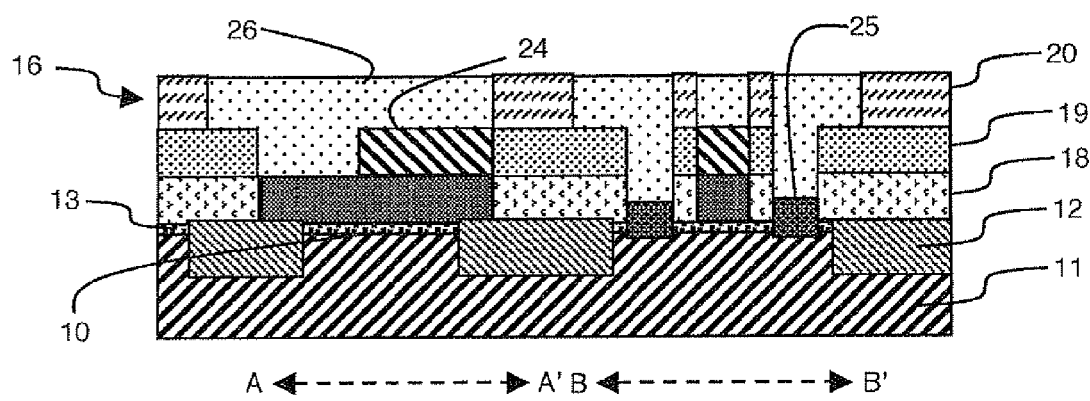

As illustrated in FIG. 21, metallic material 26 is deposited on the device so as to completely seal the empty volumes at least in the insulating layer. Metallic material 26 is then subjected to a chemical mechanical polishing step to eliminate material 26 that is situated above etching mask 16. An etching step is advantageously performed in order to thin the metallic material. This metallic material 26 will form the contact pads for the source, drain and gate and it will also form the first metallic interconnection level of the transistor.

The rest of the device is produced in conventional manner, in particular the following metallic levels of the interconnection stack.

Figures 22, 23:
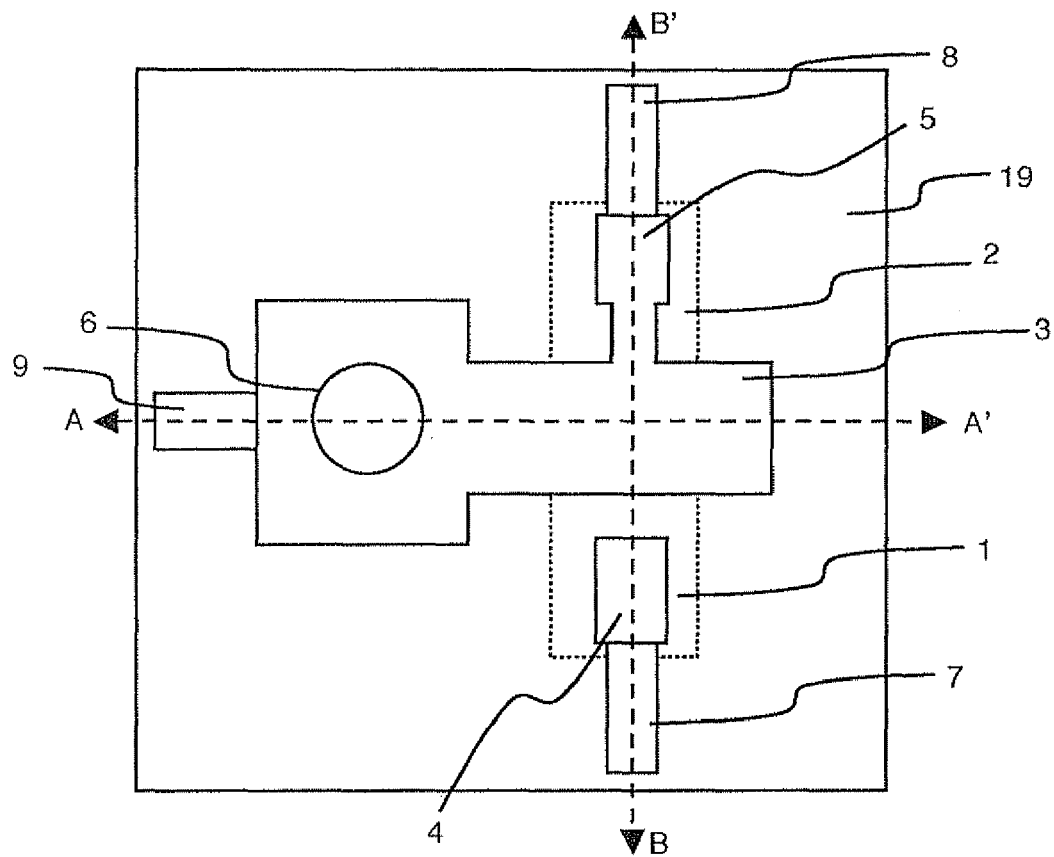
FIG. 22 represents an alternative embodiment of the method according to the invention, in schematic manner and in top view.
FIGS. 23 to 27 represent successive steps of performing another alternative of the method according to the invention, in schematic manner in top view and in cross-section.

In another alternative embodiment illustrated in FIG. 22, in etching mask 16, the gate pattern is continued by the patterns of source contact 4 and/or drain contact 5. In FIG. 22 only drain contact 5 is connected to gate electrode 3. A connecting area separates the gate electrode pattern from that of the source and/or drain contact.

The connecting area is masked when delineation of gate electrode 3 and source 4 and drain 5 contacts is performed in the insulating layer. Masking of the connecting area is performed at the same time as that of the first metal level source 7, drain 8 and gate 9 output lines and with the same techniques. Advantageously, connection is performed by a connecting area that presents a smaller transverse dimension than the longitudinal and transverse dimensions of source 4 and drain 5 contacts and of the gate electrode along axis AA' in order to avoid having to use an additional photolithographic step.

Formation of the gate and of the source and drain contacts is performed as before. The connecting area is filled by the metallic material of the first metallic interconnection level at the same time as output lines 7, 8 and 9.

Figure 24:
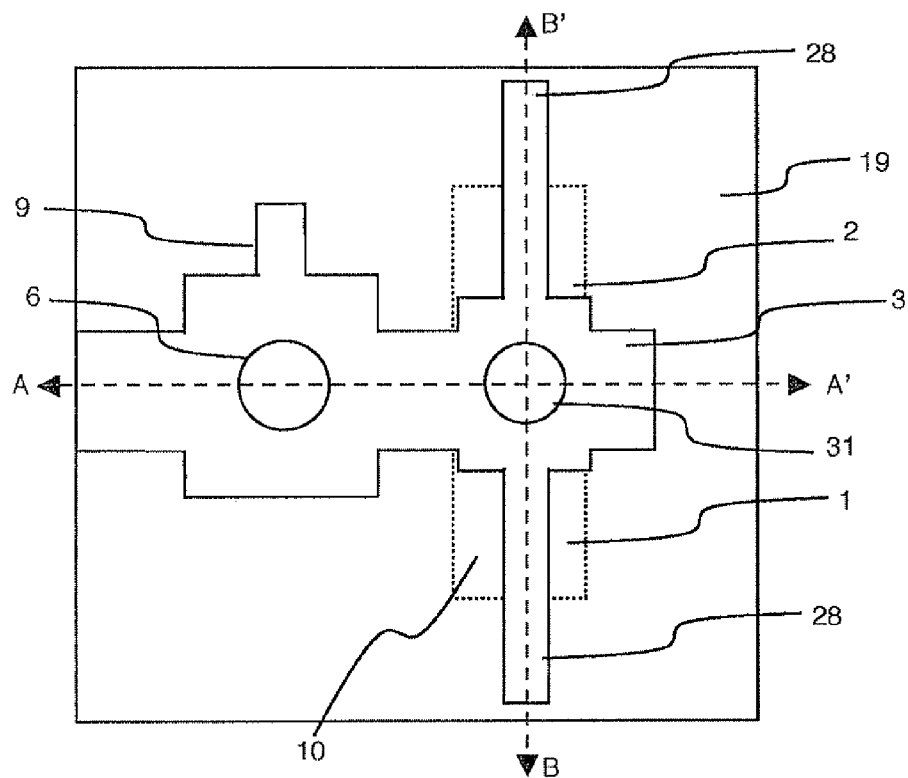

In another embodiment illustrated in FIGS. 23 to 27, a metal line of the first metal level passes through the gate electrode without this line being in electrical contact with gate material 23. The pattern of the gate electrode, in etching mask 16, presents two wide portions, the first wide portion and an additional wide portion. The first wide portion enables gate contact 6 to be defined as in the foregoing embodiments. The additional wide portion presents smaller transverse or longitudinal dimensions than the smallest of the transverse longitudinal dimensions of the first wide portion. The intermediate portion also presents smaller transverse or longitudinal dimensions than the smallest of the transverse longitudinal dimensions of the additional wide portion. A separating portion is formed between the first wide portion and the additional wide portion. The transverse dimension of the separating portion is smaller than the transverse and longitudinal dimensions of the wide portions and is at maximum equal to that of the intermediate portion. In the example of FIG. 24, the dimension of the separating portion in direction BB' is smaller than the dimensions in directions AA' and BB'.

Etching mask 16 comprises a first metal level transit line 28 which passes through the additional wide portion. The pattern of gate electrode 3 is therefore extended by two portions of transit line 28 at the level of the additional wide portion.

As in the foregoing embodiments, first metal level transit line 28 is masked when delineation of gate electrode 3 and source 4 and drain 5 contacts is performed. This masking can be achieved by any suitable technique, advantageously by imposing dimensional constraints on the transit line to avoid using an additional photolithography step. The dimensional constraints of transit lines 28 are identical to those of output lines 7, 8 and 9 of the first metal level. In this way, first plugs 21 are formed at the same time as in source 7, drain 8 and gate 9 areas of the first metal level and in transit line 28.

The fabrication method is identical to the one described in the foregoing up to FIG. 16. At this moment, the area delineating gate contact 6 is formed in the covering material and etching of covering material 24 is continued so as to reduce the thickness of covering material 24 (FIG. 23). First plugs 21 are present.

Figure 25:
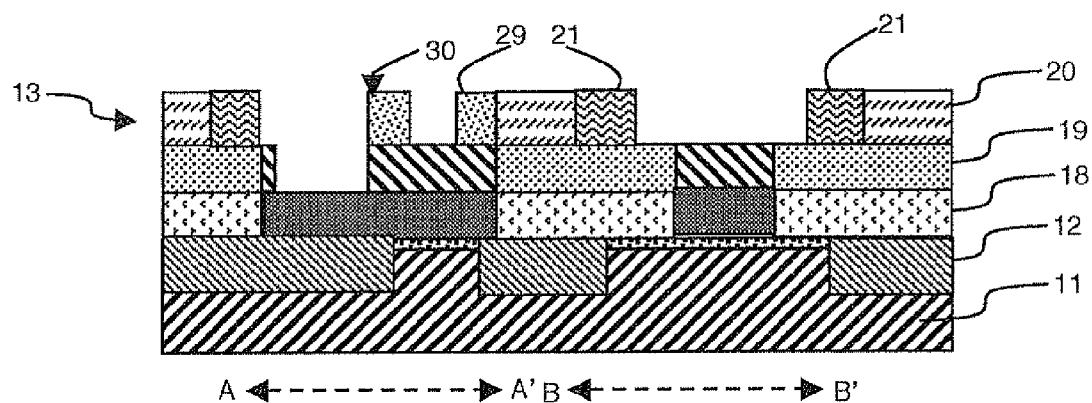

As illustrated in FIGS. 24 and 25, an additional covering material 29 is deposited in conformal manner on the device and is then isotropically etched. As for covering material 24, the geometric constraints imposed on the different portions of the pattern present in etching mask 16 mean that the separating portion located between the first wide portion and the additional wide portion is filled in before the two wide portions (FIG. 24). Isotropic etching of covering material 29 is performed at least once separating portion has been filled in. In this way, after the etching step, at least one separating pad 30 of material 29 forms separating the two wide areas (FIG. 25). During formation of this pad 30, re-delineation of gate contact 6 is also performed as the previous hole has not been filled in and delineation of an additional contact area 31 is performed in the additional wide portion. This additional contact area 31 is not connected to gate material 23. The additional contact area is linked to the shape of separating pad 30. The shape of the additional contact area is linked to the shape of the additional portion and to the thicknesses of material 29 deposited and then etched. Like the gate contact, the additional contact 31 is formed without using an additional photolithographic step and its shape also depends on the initial shape of the associated wide portion.

Figure 26:
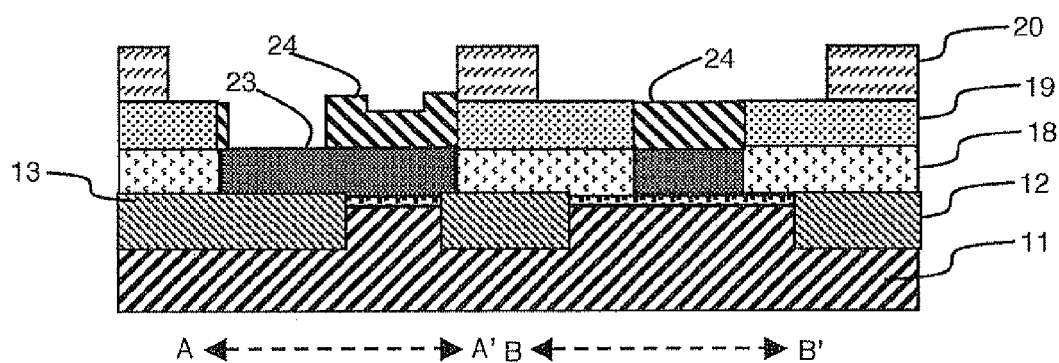

As illustrated in FIG. 26, covering material 24 and additional covering material 29 are subjected to an advantageously isotropic etching step to reduce their thickness. In this way, the surface maskwork present on covering layers 24 and 29 is reproduced and only the thickness of these layers is reduced. In an extreme case illustrated in FIG. 26, additional covering layer 29 is totally eliminated. During this etching step, source 7, drain 8 and gate 9 output lines and transit line 28 of the first metal level are open, i.e. first plugs 21 are eliminated.

Figure 27:
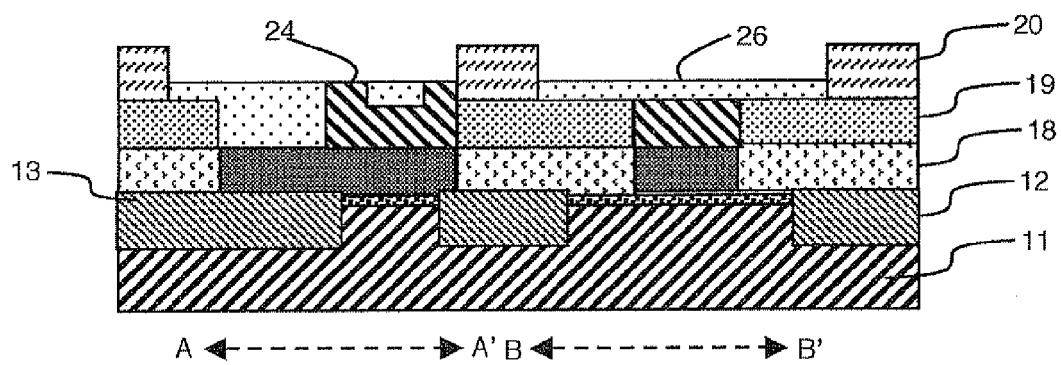

As illustrated in FIG. 27, metallic material 26 is deposited on the device to fill the void spaces and thereby form source 4, drain 5 and gate 6 contacts. The metallic material at the same time forms source 7, drain 8 and gate 9 output lines and transit line 28 of the first metal level. Metallic material 26 is subjected to chemical mechanical polishing so as to localize the latter in and underneath etching mask 16, and an isotropic or anisotropic etching step is performed to reduce the thickness of metallic material 26 and to thereby prevent short-circuiting between the gate contact and additional contact 30.

In general manner, the field effect device presents source 4 and drain 5 contacts that are self-aligned with respect to gate electrode 3. This is obtained by means of a method that comprises at least the use of an etching mask that simultaneously delineates at least source 4 and drain 5 contact areas and gate electrode 3 in insulating material 18, 19, 20. The device also presents source 7, drain 8 and gate 9 output lines that are self-aligned with respect to source 4, drain 5 and gate 6 contacts, and therefore with respect to gate electrode 3. Pad 30 that is reproduced here in layer 24 prevents short-circuiting between transit line 28 and the gate. In this way it is possible to circumvent the technological constraints related to photolithography equipment.

In certain of the embodiments described, the gate contact can also be self-aligned with respect to the gate electrode, and it is also conceivable to use the whole of the wide part of the gate as contact area 6. However, it is also possible to form a gate contact by means of an additional photolithography step although this embodiment is not very favorable.

All the embodiments described enable a field effect transistor to be produced wherein source 4 and drain 5 contact areas are self-aligned with respect to gate electrode 3 which enables devices of small dimensions to be achieved in simple and repeatable manner.

According to the embodiments and the thickness of the materials used, the relative position and the distinction between contacts and associated output lines vary. In certain embodiments, the output line can in fact be above the contact or be around the contact or coincide with the latter.

The invention claimed is:

1. A method for producing a field effect device comprising a source output line of a first metallic interconnection level connected to a source contact arranged on a source electrode, a drain output line of the first metallic interconnection level connected to a drain contact arranged on a drain electrode, and a gate output line of the first metallic interconnection level connected to a gate contact arranged on a gate electrode, the method comprising the following successive steps:

forming an insulating layer on a dielectric layer, forming an etching mask on the insulating layer, the etching mask simultaneously laterally delineating at least the gate electrode, the source contact, the drain contact, the source output line, the drain output line and the gate output line so as to obtain self-alignment of the gate electrode, the source contact, the drain contact, the source output line, the drain output line and the gate output line, the simultaneous lateral delineation substantially defining the lateral borders of each of the gate electrode, the source contact, the drain contact, the source output line, the drain output line and the gate output line, masking the source output line, the drain output line and the gate output line in the etching mask, delineating the gate electrode, the source contact and the drain contact in the insulating layer by means of the etching mask, depositing a gate material forming at least the gate electrode, forming the source contact and the drain contact at least in the insulating layer, and forming the source output line, the drain output line and the gate output line of the first metallic interconnection level in the etching mask.

2. The method according to claim 1, wherein the etching mask comprises a gate pattern including a wide portion and an intermediate portion, the transverse and longitudinal dimensions of the source output line, the drain output line and the gate output line are smaller than the smallest transverse and longitudinal dimensions of said wide portion and said intermediate portion.

3. The method according to claim 1, wherein masking the etching mask is performed only in the source output line, the drain output line and the gate output line.

4. The method according to claim 2, wherein a first sealing material is deposited in conformal manner and etched in isotropic manner so as to perform masking the etching mask.

5. The method according to claim 4, wherein the first sealing material is made from silicon or from polycrystalline or amorphous silicon-germanium alloy.

6. The method according to claim 4, comprising eliminating the first sealing material between forming the gate electrode and forming the source contact, the drain contact and the gate contact, and forming the source output line, the drain output line and the gate output line of the first metallic interconnection level.

7. The method according to claim 1, comprising forming second plugs in the source contact and in the drain contact, at least in the etching mask, before forming the gate electrode.

8. The method according to claim 7, comprising eliminating a first sealing material before forming the source contact and the drain contact.

9. The method according to claim 2, wherein the gate contact is delineated by a covering material deposited in conformal manner and etched in anisotropic manner, the gate contact being located in the wide portion.

10. A method for producing a field effect device including a source output line of a first metallic interconnection level connected to a source contact arranged on a source electrode, a drain output line of the first metallic interconnection level connected to a drain contact arranged on a drain electrode, and a gate output line of the first metallic interconnection level connected to a gate contact arranged on a gate electrode, the method comprising the following successive steps:

forming an insulating layer on a dielectric layer, forming an etching mask laterally delineating the gate electrode, the source contact, the drain contact, the source output line, the drain output line and the gate output line so as to obtain self-alignment of the gate electrode, the source contact, the drain contact, the source output line, the drain output line and the gate output line, the lateral delineation substantially defining the lateral borders of each of the gate electrode, the source contact, the drain contact, the source output line, the drain output line and the gate output line, masking the source output line, the drain output line and the gate output line in the etching mask, etching the insulating layer so as to delineate the gate electrode, the source contact and the drain contact in the insulating layer, depositing a gate material forming at least the gate electrode, forming the source contact and the drain contact at least in the insulating layer, and forming the source output line, the drain output line and the gate output line of the first metallic interconnection level in the etching mask.

11. The method according to claim 10, wherein the etching mask comprises a gate pattern including a wide portion and an intermediate portion, the transverse and longitudinal dimensions of the source output line, the drain output line and the gate output line are smaller than the smallest transverse and longitudinal dimensions of said wide portion and said intermediate portion.

12. The method according to claim 10, wherein masking the etching mask is performed only in the source output line, the drain output line and the gate output line.

13. The method according to claim 10, comprising forming second plugs in the source contact and in the drain contact, at least in the etching mask, before forming the gate electrode.

14. The method according to claim 11, wherein the gate contact is delineated by a covering material deposited in conformal manner and etched in anisotropic manner, the gate contact being located in the wide portion.

15. A method for producing a field effect device including a source output line of a first metallic interconnection level connected to a source contact arranged on a source electrode, a drain output line of the first metallic interconnection level connected to a drain contact arranged on a drain electrode, and a gate output line of the first metallic interconnection level connected to a gate contact arranged on a gate electrode, the method comprising the following successive steps:

forming an insulating layer on a dielectric layer, forming an etching mask on the insulating layer, the etching mask laterally delineating at least the gate electrode, the source contact, the drain contact, the source output line, the drain output line and the gate output line so as to obtain self-alignment of the gate electrode, the source contact, the drain contact, the source output line, the drain output line and the gate output line, the lateral delineation substantially defining the lateral borders of each of the gate electrode, the source contact, the drain contact, the source output line, the drain output line and the gate output line, masking the source output line, the drain output line and the gate output line in the etching mask on the insulating layer, delineating the gate electrode, the source contact and the drain contact in the insulating layer by means of the etching mask, depositing a gate material forming at least the gate electrode, forming the source contact and the drain contact at least in the insulating layer, and forming the source output line, the drain output line and the gate output line of the first metallic interconnection level in the etching mask.

16. The method according to claim 15, wherein the etching mask comprises a gate pattern including a wide portion and an intermediate portion, the transverse and longitudinal dimensions of the source output line, the drain output line and the gate output line are smaller than the smallest transverse and longitudinal dimensions of said wide portion and said intermediate portion.

17. The method according to claim 15, wherein masking the etching mask is performed only in the source output line, the drain output line and the gate output line.

18. The method according to claim 15, comprising forming second plugs in the source contact and in the drain contact, at least in the etching mask, before forming the gate electrode.

19. The method according to claim 16, wherein the gate contact is delineated by a covering material deposited in conformal manner and etched in anisotropic manner, the gate contact being located in the wide portion.

* * * * *